(12) United States Patent
Tsinker

(10) Patent No.: US 8,884,711 B2
(45) Date of Patent: Nov. 11, 2014

(54) MEMS DEVICE OSCILLATOR LOOP WITH AMPLITUDE CONTROL

(71) Applicant: InvenSense, Inc., Sunnyvale, CA (US)

(72) Inventor: Vadim Tsinker, Belmont, CA (US)

(73) Assignee: InvenSense, Inc., San Jose, CA (US)

( * ) Notice: Subject to any disclaimer, the term of this patent is extended or adjusted under 35 U.S.C. 154(b) by 38 days.

(21) Appl. No.: 13/625,690

(22) Filed: Sep. 24, 2012

(65) Prior Publication Data

US 2014/0085017 A1   Mar. 27, 2014

(51) Int. Cl.
*H03B 5/04* (2006.01)
*H03B 5/30* (2006.01)
*H03L 1/00* (2006.01)

(52) U.S. Cl.
CPC .. *H03B 5/30* (2013.01); *H03B 5/04* (2013.01); *H03L 1/00* (2013.01); *H03B 2202/042* (2013.01)
USPC ........... 331/154; 331/135; 331/160; 331/183; 331/186

(58) Field of Classification Search
CPC .............. H03B 5/04; H03B 5/30; H03B 5/32; H03B 5/36; H03B 5/362; H03B 5/364; H03B 2202/042; H03L 1/00; H03L 5/00; H03L 5/02
USPC ................ 327/535, 538; 331/15, 108 B, 109, 331/116 FE, 116 M, 116 R, 135, 154, 158, 331/160, 182, 183, 185, 186
See application file for complete search history.

(56) References Cited

U.S. PATENT DOCUMENTS

| | | | | |
|---|---|---|---|---|
| 4,277,758 | A | * | 7/1981 | Mishiro .................... 331/1 R |
| 5,030,926 | A | * | 7/1991 | Walden .................. 331/116 FE |
| 5,485,128 | A | * | 1/1996 | Azuma ..................... 331/135 |
| 6,278,338 | B1 | * | 8/2001 | Jansson ................. 331/116 FE |
| 6,861,917 | B2 | * | 3/2005 | Stevenson et al. ............ 331/183 |
| 7,123,111 | B2 | * | 10/2006 | Brunson et al. .......... 331/116 M |
| 7,598,821 | B2 | * | 10/2009 | Novac ........................... 331/160 |
| 8,228,127 | B2 | * | 7/2012 | Rebel et al. .................... 331/17 |
| 8,228,130 | B1 | * | 7/2012 | Ivanov et al. ............ 331/116 M |
| 8,466,754 | B1 | * | 6/2013 | Olen et al. ............... 331/116 M |
| 8,552,808 | B2 | * | 10/2013 | Delzer et al. ................. 331/185 |
| 2012/0092080 | A1 | * | 4/2012 | Nemoto et al. ......... 331/116 FE |
| 2012/0182077 | A1 | * | 7/2012 | Yamakawa et al. ............. 331/34 |

* cited by examiner

*Primary Examiner* — Levi Gannon

(74) *Attorney, Agent, or Firm* — Sawyer Law Group, P.C.

(57) ABSTRACT

A MEMS device and method for amplitude regulation of a MEMS device are disclosed. In a first aspect, the MEMS device comprises a MEMS resonator, a limiter coupled to the MEMS resonator, and a regulator coupled to the limiter. The MEMS device includes an amplitude control circuit coupled to the MEMS resonator. The amplitude control circuit controls a supply of the limiter via the regulator to regulate oscillation loop amplitude of the MEMS device. In a second aspect, the method includes coupling a regulator to the limiter, coupling an amplitude control circuit to the MEMS resonator, and controlling a supply of the limiter via the regulator to regulate oscillation loop amplitude of the MEMS device.

20 Claims, 4 Drawing Sheets

MEMS DEVICE OSCILLATOR LOOP WITH AMPLITUDE CONTROL

FIELD OF THE INVENTION

The present invention relates to Microelectromechanical Systems (MEMS) devices, and more particularly, to regulation of oscillation amplitude of a MEMS device.

BACKGROUND

MEMS devices (e.g. accelerometers, gyroscopes, compasses, pressure sensors, oscillators, etc.) operate by detecting inertial forces on proof-masses. Significant process variations, can affect MEMS device's quality factor, which requires the electronic portion of the resonance loop to be able to handle large gain variations in order to stabilize loop amplitude. Additionally, low resonance frequencies require large resistor and capacitor components in the electronic portion of the loop to maintain proper oscillation and amplitude stability.

Conventionally, large gain variation is handled with trimming, which increases testing time, reduces loop stability, and necessitates use of more precise, and less dense, capacitors that significantly increases circuit area. There is a strong need for a cost-effective solution for gain trimming, stability control, and a reduction of MEMS device circuitry area by using denser capacitors. The present invention addresses such a need.

SUMMARY OF THE INVENTION

A MEMS device and method for amplitude regulation of a MEMS device are disclosed. In a first aspect, the MEMS device comprises a MEMS resonator, a limiter coupled to the MEMS resonator, and a regulator coupled to the limiter. The MEMS device includes an amplitude control circuit coupled to the MEMS resonator. The amplitude control circuit controls a supply of the limiter via the regulator to regulate oscillation loop amplitude of the MEMS device.

In a second aspect, the method includes coupling a regulator to the limiter, coupling an amplitude control circuit to the MEMS resonator, and controlling a supply of the limiter via the regulator to regulate oscillation loop amplitude of the MEMS device.

BRIEF DESCRIPTION OF THE DRAWINGS

The accompanying figures illustrate several embodiments of the invention and, together with the description, serve to explain the principles of the invention. One of ordinary skill in the art readily recognizes that the particular embodiments illustrated in the figures are merely exemplary, and are not intended to limit the scope of the present invention.

DETAILED DESCRIPTION

The present invention relates to Microelectromechanical Systems (MEMS) devices, and more particularly, to regulation of oscillation amplitude of a MEMS device. The following description is presented to enable one of ordinary skill in the art to make and use the invention and is provided in the context of a patent application and its requirements. Various modifications to the described embodiments and the generic principles and features described herein will be readily apparent to those skilled in the art. Thus, the present invention is not intended to be limited to the embodiments shown but is to be accorded the widest scope consistent with the principles and features described herein.

A system and method in accordance with the present invention provides amplitude regulation of a MEMS device, wherein the MEMS device includes a MEMS resonator, a receiver coupled to the MEMS resonator, a phase shifter coupled to the receiver, and a limiter coupled to the phase shifter. By coupling a regulator to the limiter and an amplitude control circuit to the MEMS resonator, a supply of the limiter is controlled via the regulator to regulate an oscillation loop amplitude of the MEMS device. The coupling of the regulator to the limiter and the amplitude control circuit to the MEMS resonator creates additional circuitry that restricts the open loop gain of the oscillation loop to unity, resulting in a stabilization of the oscillation loop amplitude at a particular voltage target.

To describe the features of the present invention in more detail, refer now to the following description in conjunction with the accompanying Figures.

Figure 1:
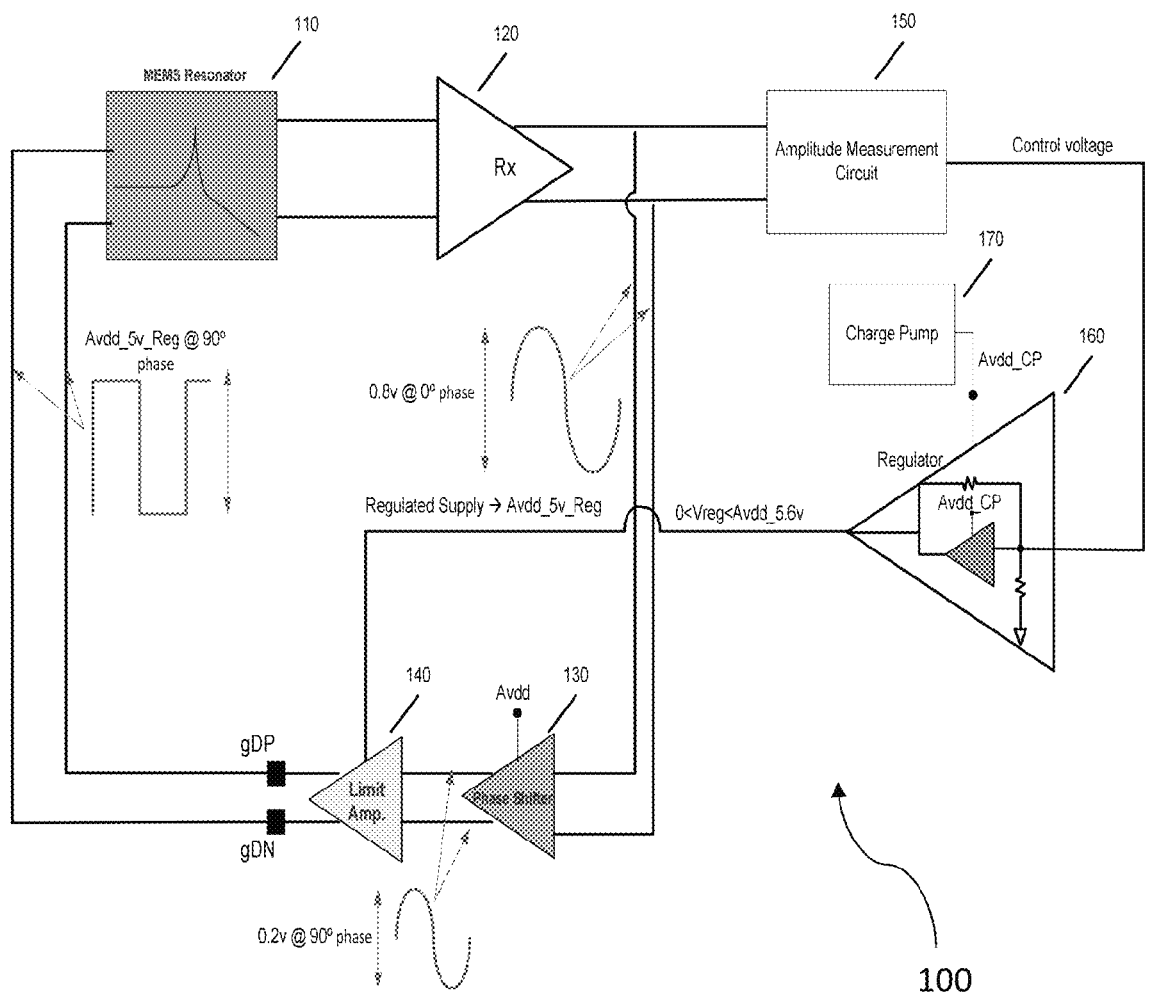
FIG. 1 illustrates a block diagram of a MEMS device in accordance with an embodiment.

FIG. 1 illustrates a block diagram of a MEMS device 100 in accordance with an embodiment. The MEMS device 100 includes an oscillation loop that comprises a MEMS resonator 110, a receiver 120 coupled to the MEMS resonator 110, a phase shifter 130 coupled to the receiver 120, and a limit amplifier (limiter) 140 coupled to the phase shifter 130. In one embodiment, the MEMS resonator 110 has a high gain at a narrow frequency range around resonance frequency and has a low gain at all other frequencies.

The MEMS device 100 further includes an amplitude control loop that comprises an amplitude measurement circuit 150 coupled to the receiver 120 and to the phase shifter 130, a voltage regulator circuit (regulator) 160 coupled to the amplitude measurement circuit 150 and to the limiter 140, and a charge pump circuit 170 coupled to the regulator 160. Thus, the amplitude control loop is added to the oscillation loop of the MEMS device to restrict the open loop gain of the oscillation loop which results in target amplitude detection and control.

In one embodiment, the oscillation loop oscillates and generates a constantly increasing voltage amplitude at the output of the receiver 120 if the open loop gain of the oscillation loop is greater than 1 and the phase shift of a signal inside the open (broken) oscillation loop is 180°. In the oscillation loop, approximately 90° of the phase shift is provided by the MEMS resonator 110 and another approximately 90° of the phase shift is provided by the phase shifter 130.

In one embodiment, the amplitude control loop detects and controls a target amplitude (the oscillator voltage output level) by controlling the output level of the limiter 140 which is adjusted by adjusting the limiter's supply rail. Accordingly, the limiter 140 never has an output that exceeds the voltage generated by the regulator 160 which is the supply of the limiter 140.

In this embodiment, the limiter 140 has a high gain and converts a small sinusoidal input to a square wave output whose swing ranges from 0V to a regulated voltage generated by the regulator 160. The limiter 140 and regulator 160 control the supply of the limiter 140 enabling an output range of the limiter 140 to be continuously adjusted from nearly 0V to any high voltage including but not limited to voltages above circuit supply levels and up to a voltage level generated by the charge pump circuit 170.

Figure 2:
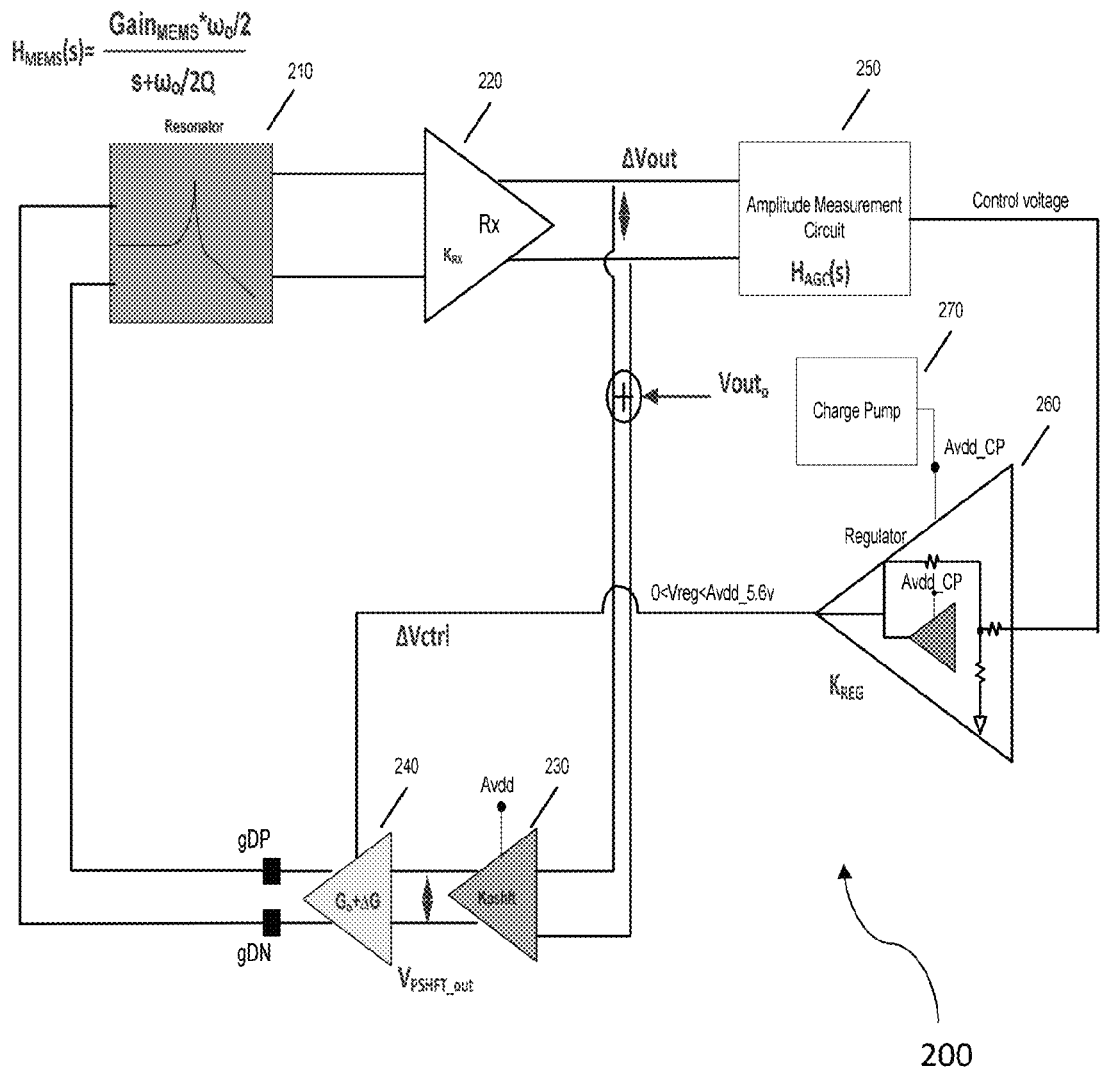
FIG. 2 illustrates a block diagram of a MEMS device in accordance with an embodiment.

FIG. 2 illustrates a block diagram of a MEMS device 200 in accordance with an embodiment. The MEMS device 200 architecture resembles the MEMS device 100 architecture. Additionally, in FIG. 2, each circuit element of a control loop of the MEMS device 200 lists its amplitude gain parameter inside the symbol representing that particular circuit element block.

In one embodiment, utilizing the amplitude gain parameters of the control loop of the MEMS device 200, an equation for a first transfer function of the oscillation loop amplitude response is determined. The first transfer function determines the oscillation loop amplitude response at an output ($\Delta V_{out}$) of the receiver 220 based upon a change in a limiter control voltage ($\Delta V_{ctrl}$) which is represented by ($\Delta V_{out}$)/($\Delta V_{ctrl}$). The amplitude gains of the amplitude control loop elements (the amplitude control circuit and the regulator) are incorporated into the first transfer function to determine an amplitude control loop gain transfer function. As will be described in greater detail later, the amplitude control loop gain transfer function is independent of MEMS quality factor, phase shifter gain $K_{pshft}$, and limiter gain $G_o$, which significantly improves loop stability.

In one embodiment, the amplitude gain parameter for the MEMS resonator 210 is $H_{MEMS}(s)=(Gain_{MEMS}*\omega_o/2)/(s+\omega_o/2Q)$, where the amplitude gain at DC is $Gain_{MEMS}/Q$, where $GAIN_{MEMS}$ is the resonator gain at its resonance frequency, and where Q is the quality factor. The amplitude gain for the receiver 220 is $K_{RX}$, the amplitude gain for the phase shifter 230 is $K_{pshft}$, and the amplitude gain for the limiter 240 is $G_o+\Delta G$, where $G_o$ is a fixed portion of the gain and $\Delta G$ is a variable portion of the gain. The amplitude gain for the amplitude measurement circuit 250 is $H_{AGC}(s)$, and the amplitude gain for the regulator 260 is $K_{REG}$.

The output of the receiver 220 is also separated into a fixed portion ($Vout_o$) and a variable portion ($\Delta Vout$). Accordingly, output of the limiter 240 is dependent upon both the fixed and variable portions of the input to the limiter 240 as well as both the fixed and variable portions of the gain of the limiter 240. In this embodiment, the output of the limiter $V_{LIMIT}=(G_o+\Delta G)*K_{PSHFT}*(Vout_o+\Delta Vout)$, where $G_o*K_{PSHFT}*Vout_o$ is a constant and does not affect loop transfer function and where $\Delta G*K_{PSHFT}*\Delta Vout$ is small because it involves a pair of small delta terms. Furthermore, $V_{LIMIT}\approx K_{PSHFT}*(\Delta G*Vout_o+G_o*\Delta Vout)$ and the following equations are derived by including the amplitude gain of the MEMS resonator 210 and the receiver 220 (where $K_{RX}=1$) and by proceeding around the oscillation loop of the MEMS device 200:

$$K_{PHSFT}*(\Delta G*V_{OUT_0}+G_0*\Delta V_{OUT})*\frac{Gain_{MEMS}*\omega_o/2}{s+\omega_o/2Q}=\Delta V_{OUT} \quad (1)$$

During oscillation at a stable amplitude, the gain of the circuit block elements 210, 220, 230, and 240 is unity, which results in the following equation:

$$K_{PHSFT}*Gain_{MEMS}*Q*G_0=1 \quad (2).$$

By substituting equation (2) into equation (1) and rearranging terms, the following equations are derived:

$$\frac{\Delta V_{OUT}}{\Delta G}=V_{OUT_0}*\frac{K_{PHSFT}*Gain_{MEMS}*\omega_o/2}{s}; \quad (3)$$

$$K_{PHSFT}=V_{PSHFT\_out}/(V_{OUT_0}+\Delta V_{OUT})\approx V_{PSHFT\_out}/V_{OUT_0}. \quad (4)$$

By substituting for $K_{PSHFT}$ from equation (4) into equation (3), the following equation is derived:

$$\frac{\Delta V_{OUT}}{\Delta G}=V_{PSHFT\_out}*\frac{Gain_{MEMS}*\omega_o/2}{s}. \quad (5)$$

The gain of the limiter 240 is described as:

$$G_o=V_{drv\_out}/V_{PSHFT\_out} \quad (6).$$

A change in gain of the limiter 240 is described as:

$$\Delta G=\Delta V_{drv\_out}/V_{PSHFT\_out}=(V_{drv\_out2}-V_{drv\_out1})/V_{PSHFT\_out}=(4/\pi)*(V_{CTRL2}-V_{CTRL1})/V_{PSHFT\_out}=(4/\pi)*\Delta V_{PSHFT\_out} \quad (7);$$

$$\text{where } V_{drv\_out2}-V_{drv\_out1}=(4/\pi)*(V_{CTRL2}-V_{CTRL1}) \quad (8).$$

The output of the limiter 240 follows the supply of the limiter 240 and the amplitude of the main harmonic of the output of the limiter 240 is multiplied by $4/\pi$ because the output of the limiter 240 is a square wave, resulting in the following equation:

$$\Delta G/\Delta V_{CTRL}=(4/\pi)/V_{PSHFT\_out} \quad (9).$$

By multiplying equation (5) by equation 9, the following equation is derived:

$$\frac{\Delta V_{OUT}}{\Delta V_{CTRL}}=-\frac{4}{\pi}\frac{Gain_{MEMS}*\omega_o/2}{s}. \quad (10)$$

Equation (10) denotes the first transfer function of the oscillation loop amplitude response describing the effect of a change of the limiter 240 control voltage on a change in amplitude of the oscillation loop output at the receiver 220.

Figure 3:
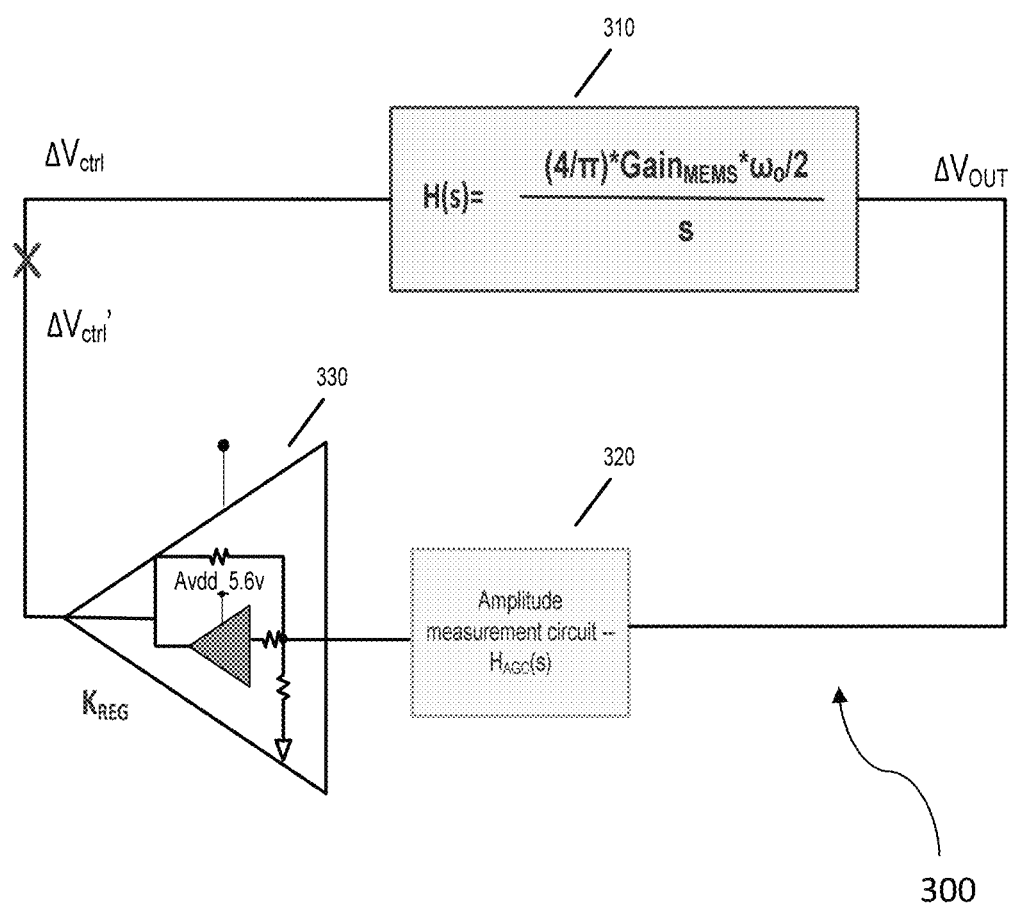
FIG. 3 illustrates a simplified amplitude control loop diagram in accordance with an embodiment.

FIG. 3 illustrates a simplified amplitude control loop diagram 300 in accordance with an embodiment. The amplitude control loop diagram 300 includes block 310 which represents the oscillation loop elements 210, 220, 230, and 240 of the MEMS device 200. A transfer function of block 310 is described by equation (10). Diagram 300 further includes the amplitude control circuit 320 and the regulator 330 which resemble the amplitude control circuit 250 and the regulator 260 elements from FIG. 2.

To determine the amplitude control loop gain transfer function, the loop is broken (denoted by the X in FIG. 3) and the transfer function of signals after the break and before the break are evaluated, resulting in the following equation:

$$\frac{\Delta V'_{CTRL}}{\Delta V_{CTRL}}=-\frac{4}{\pi}\frac{Gain_{MEMS}*\omega_o/2}{s}*K_{REG}*H_{AGC}. \quad (11)$$

The amplitude control loop gain transfer function has a stable gain because $Gain_{MEMS}$ and $H_{AGC}$ do not vary by more than a certain value including but not limited to +−30% each and $K_{REG}$ is fixed by design. The relative invariance of gain parameters obviates the need for complicated trimming and gain adjustment elements that are typically required to ensure amplitude loop stability and that require increased testing time. A tighter control of loop gain parameters also creates a smaller variation in loop gain and phase, thus facilitating a reduction in size of compensation capacitors, which results in a significant reduction in total circuit area of the MEMS device 200.

Furthermore, the square wave drive of the MEMS device 200 provides higher energy signal into the MEMS resonator 210 which enables the voltage magnitude of the charge pump circuit 270 to be reduced, which in turn, simplifies the design of the charge pump circuit 270 and reduces the area of the charge pump circuit 270.

Figure 4:
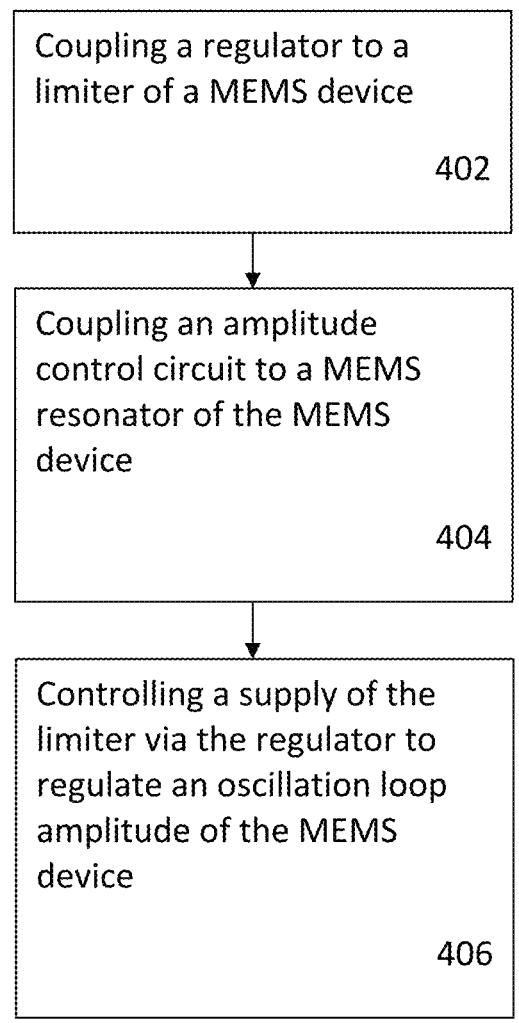
FIG. 4 illustrates a method for amplitude regulation of a MEMS device in accordance with an embodiment.

FIG. 4 illustrates a method 400 for amplitude regulation of a MEMS device in accordance with an embodiment. In the method 400, the MEMS device comprises a MEMS resonator and a limiter coupled to the MEMS resonator. In another embodiment, the MEMS device comprises a MEMS resonator, a receiver coupled to the MEMS resonator, a phase shifter coupled to the receiver, and a limiter coupled to the phase shifter. The method 400 includes coupling a regulator to the limiter, via step 402 and coupling an amplitude control circuit to the MEMS resonator, via step 404. The method 400 further includes controlling a supply of the limiter via the regulator to regulate oscillation loop amplitude of the MEMS device, via step 406.

In one embodiment, a method for amplitude regulation of a MEMS device further includes driving the MEMS resonator with a phase shifted signal of adjustable amplitude, sensing (receiving) the MEMS resonator output by the receiver, and evaluating an amplitude of the MEMS resonator output by the amplitude measurement circuit. The method includes converting the output signal of the amplitude measurement circuit into a supply of the limiter which drives the MEMS resonator by a regulator, wherein a charge pump circuit provides maximum possible regulator output signal level which drives the supply of the regulator.

As above described, the system and method allow for amplitude regulation of a MEMS device comprises a MEMS resonator, a receiver coupled to the MEMS resonator, a phase shifter coupled to the receiver, and a limiter coupled to the phase shifter, a regulator coupled to the limiter, and an amplitude control circuit coupled to the MEMS resonator. By coupling a regulator to the limiter and the amplitude control circuit to the MEMS resonator, a supply of the limiter is controlled via the regulator to regulate oscillation loop amplitude of the MEMS device. The MEMS device circuitry area is reduced and the amplitude regulation is simplified by controlling the limiter's supply and output signal level resulting in improved oscillation loop amplitude stability and a nearly unlimited output signal range between 0V and a voltage generated by the charge pump.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A MEMS device, comprising:
   a MEMS resonator;
   a limiter coupled to the MEMS resonator;
   a regulator coupled to the limiter; and
   an amplitude measurement circuit coupled to the MEMS resonator, wherein the amplitude measurement circuit controls a supply of the limiter via the regulator to regulate oscillation loop amplitude of the MEMS device; and wherein the limiter has a high gain and converts a sinusoidal input to a square wave output whose swing is controlled by the regulator.

2. The MEMS device of claim 1, wherein the supply of the limiter is adjusted by the regulator from proximate 0V to a voltage level above circuit supply level.

3. The MEMS device of claim 2, further comprising:
   a charge pump circuit coupled to the regulator to supply the voltage level above circuit supply level.

4. The MEMS device of claim 3, further comprising:
   a receiver coupled to the MEMS resonator; and
   a phase shifter coupled to the limiter.

5. The MEMS device of claim 4, wherein the MEMS resonator, the receiver, the phase shifter, and the limiter comprise an oscillation loop and the amplitude measurement circuit and the regulator comprise an amplitude control loop.

6. The MEMS device of claim 5, wherein an open loop gain of the oscillation loop is restricted to unity to stabilize the oscillation loop amplitude at a target voltage.

7. The MEMS device of claim 4, wherein the MEMS resonator and the phase shifter provide a combined 180° of phase shift.

8. The MEMS device of claim 1, further comprising:
   an amplitude control loop gain transfer function that is independent from a quality factor of the MEMS resonator.

9. The MEMS device of claim 1, wherein the supply of the limiter drives the MEMS resonator with a signal of adjustable amplitude.

10. The MEMS device of claim 1, wherein the MEMS resonator includes a high gain at a narrow frequency range proximate resonance frequency.

11. A method for amplitude regulation of a MEMS device comprising a MEMS resonator and a limiter coupled to the MEMS resonator, the method comprising:
   coupling a regulator to the limiter;
   coupling an amplitude measurement circuit to the MEMS resonator; and
   controlling a supply of the limiter via the regulator to regulate oscillation loop amplitude of the MEMS device, wherein the limiter has a high gain and converts a sinusoidal input to a square wave output whose swing is controlled by a regulator.

12. The method of claim 11, further comprising:
   evaluating an output signal level of the MEMS resonator; and
   adjusting a drive output swing of the limiter.

13. The method of claim 11, further comprising:
   adjusting the supply of the limiter by the regulator from proximate 0V to a voltage level above circuit supply level.

14. The method of claim 13, further comprising:
   coupling a charge pump circuit to the regulator to supply the voltage level above circuit supply level.

15. The method of claim 11, wherein the MEMS device further comprises a receiver coupled to the MEMS resonator and a phase shifter coupled to the limiter.

16. The method of claim 15, wherein the MEMS resonator, the receiver, the phase shifter, and the limiter comprise an oscillation loop and the amplitude measurement circuit and the regulator comprise an amplitude control loop, further comprising:

restricting open loop gain of the oscillation loop to unity to stabilize the oscillation loop amplitude at a target voltage.

17. The method of claim 15, further comprising:
providing 180° of phase shift by both the MEMS resonator and the phase shifter.

18. The method of claim 11, further comprising:
determining an amplitude control loop gain transfer function, wherein the amplitude control loop gain transfer function is independent from a quality factor of the MEMS resonator.

19. The method of claim 11, further comprising:
evaluating amplitude of the MEMS resonator output by the amplitude measurement circuit to provide a signal; and
converting the signal into a supply of the limiter by the regulator.

20. The method of claim 19, further comprising:
driving the MEMS resonator with a signal of adjustable amplitude by the supply of the limiter.

* * * * *